(12) United States Patent
Chou et al.

(10) Patent No.: US 10,079,222 B2
(45) Date of Patent: Sep. 18, 2018

(54) PACKAGE-ON-PACKAGE STRUCTURE AND MANUFACTURING METHOD THEREOF

(71) Applicant: Powertech Technology Inc., Hsinchu County (TW)

(72) Inventors: Chien-Wei Chou, Hsinchu County (TW); Yong-Cheng Chuang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/353,721

(22) Filed: Nov. 16, 2016

(65) Prior Publication Data

US 2018/0138149 A1    May 17, 2018

(51) Int. Cl.
*H01L 23/48* (2006.01)
*H01L 25/065* (2006.01)
(Continued)

(52) U.S. Cl.
CPC ...... *H01L 25/0657* (2013.01); *H01L 21/4821* (2013.01); *H01L 23/3128* (2013.01); *H01L 23/49541* (2013.01); *H01L 23/49568* (2013.01); *H01L 23/49827* (2013.01); *H01L 23/49838* (2013.01); *H01L 23/49861* (2013.01); *H01L 25/50* (2013.01); *H05K 1/0203* (2013.01); *H05K 1/111* (2013.01); *H05K 1/181* (2013.01); *H01L 2224/16227* (2013.01); *H01L 2224/16235* (2013.01); *H01L 2224/48091* (2013.01); *H01L 2224/48106* (2013.01); *H01L 2224/48227* (2013.01); *H01L 2225/0651* (2013.01); *H01L 2225/06517* (2013.01); *H01L 2225/06548* (2013.01); *H01L 2225/06572* (2013.01); *H01L 2225/06579* (2013.01); *H01L 2225/06586* (2013.01); *H01L 2225/06589* (2013.01);
(Continued)

(58) Field of Classification Search
CPC ........... H01L 25/0657; H01L 23/49827; H01L 21/4821; H01L 23/3128; H01L 23/49861; H01L 23/49838
See application file for complete search history.

(56) References Cited

U.S. PATENT DOCUMENTS

7,126,829 B1 * 10/2006 Yen ........................ H01L 25/105
361/803
7,227,249 B1 * 6/2007 Chiang ............... H01L 23/4951
257/666
(Continued)

*Primary Examiner* — A. Sefer
(74) *Attorney, Agent, or Firm* — JCIPRNET (57) ABSTRACT

A POP structure includes a circuit board, a bottom package structure, a top package structure, and a metal frame structure. The circuit board has a plurality of signal pads and dummy pads. The dummy pads surround the signal pads. The bottom package structure is disposed over the circuit board. The bottom package structure is electrically connected to the signal pads. The top package structure is disposed over the bottom package structure. The top package structure is electrically connected to the bottom package structure. The metal frame structure includes a body and a plurality of terminal pins. The body is located between the top package structure and the bottom package structure. The terminal pins extend outward from an edge of the top package structure to connect the top package structure and the dummy pads of the circuit board.

18 Claims, 7 Drawing Sheets

(51) Int. Cl.
  *H05K 1/18*   (2006.01)
  *H05K 1/11*   (2006.01)
  *H01L 23/495* (2006.01)
  *H01L 23/498* (2006.01)
  *H01L 23/31*  (2006.01)
  *H01L 25/00*  (2006.01)
  *H01L 21/48*  (2006.01)
  *H05K 1/02*   (2006.01)

(52) U.S. Cl.
  CPC .............. *H01L 2924/1433* (2013.01); *H01L 2924/1434* (2013.01)

(56) References Cited

U.S. PATENT DOCUMENTS

| | | | |
|---|---|---|---|
| 2007/0194427 A1* | 8/2007 | Choi | H01L 23/3121 257/686 |
| 2008/0054437 A1* | 3/2008 | Hwang | H01L 23/49811 257/686 |
| 2009/0008765 A1* | 1/2009 | Yamano | H01L 21/565 257/690 |
| 2009/0127679 A1* | 5/2009 | Fan | H01L 23/4951 257/666 |
| 2009/0146314 A1* | 6/2009 | Akaike | H01L 25/0652 257/777 |
| 2012/0086109 A1* | 4/2012 | Kim | H01L 21/561 257/659 |
| 2012/0159118 A1 | 6/2012 | Wong et al. | |
| 2014/0015119 A1* | 1/2014 | Bonkohara | H01L 23/473 257/713 |

\* cited by examiner

PACKAGE-ON-PACKAGE STRUCTURE AND MANUFACTURING METHOD THEREOF

BACKGROUND OF THE INVENTION

1. Field of the Invention

The present invention generally relates to a Package-On-Package (POP) structure and a manufacturing method thereof, and more particularly, to a POP structure having a metal frame structure for heat dissipation.

2. Description of Related Art

In order for electronic product design to achieve being light, slim, short, and small, semiconductor packaging technology has kept progressing, in attempt to develop products that are smaller in volume, lighter in weight, higher in integration, and more competitive in market. For example, 3D stacking technologies such as POP (Package-On-Package) have been developed to meet the requirements of smaller footprints with higher densities. However, thermal accumulation may occur in the packages during operation of the devices, thereby causing negative impact on the POP structure. As such, reducing thermal accumulation in the packages has become a challenge to researchers in the field.

SUMMARY OF THE INVENTION

The invention provides a POP structure and a manufacturing method thereof, which effectively enhances heat dissipation.

The invention provides a POP structure including a circuit board, a bottom package structure, a top package structure, and a metal frame structure. The circuit board has a plurality of signal pads and a plurality of dummy pads. The dummy pads surround the signal pads. The bottom package structure is disposed over the circuit board. The bottom package structure is electrically connected to the signal pads of the circuit board. The top package structure is disposed over the bottom package structure. The top package structure is electrically connected to the bottom package structure. The metal frame structure includes a body and a plurality of terminal pins. The body is located between the top package structure and the bottom package structure. The terminal pins extend outward from an edge of the top package structure to connect the top package structure and the dummy pads of the circuit board.

The invention provides a POP structure including a circuit board, a bottom package structure, and a top package structure. The circuit board has a plurality of signal pads and a plurality of dummy pads. The dummy pads surround the signal pads. The bottom package structure is electrically connected to the signal pads of the circuit board. The top package structure is disposed over the bottom package structure. The top package structure includes a metal frame structure, the metal frame structure includes a first body, a plurality of second bodies, and a plurality of terminal pins. The second bodies are electrically connected to the bottom package structure and the first body is electrically insulated from the second bodies. The terminal pins extend outward from the first body to connect the top package structure and the dummy pads of the circuit board.

The invention provides a manufacturing method of a POP structure. The method includes the following steps. A bottom package structure is formed. A top package structure is formed. A metal frame structure is formed. The metal frame structure is connected to the top package structure. The metal frame structure includes at least one body and a plurality of terminal pins extend outward from the at least one body. The top package structure is stacked over the bottom package structure. The top package structure is electrically connected to the bottom package structure. The bottom package structure having the top package disposed thereon is formed over a circuit board. The circuit board has a plurality of signal pads and a plurality of dummy pads. The dummy pads surround the signal pads. The bottom package structure is electrically connected to the signal pads. The terminal pins of the metal frame structure is connected to the dummy pads.

Based on the above, a metal frame structure is formed between the top package structure and the bottom package structure. Therefore, heat generated by the top package structure and the bottom package structure during operation may be effectively dissipated with the aid of the metal frame structure. As a result, the cooling efficiency of the POP structure may be significantly enhanced, thereby providing better performance in the devices utilizing the POP structure.

DESCRIPTION OF THE EMBODIMENTS

The accompanying drawings are included to provide further understanding, and are incorporated in and constitute a part of this specification. The accompanying drawings illustrate exemplary embodiments in a simplified schematic views and, together with the description, serve to explain the principles of the disclosure, the disclosure is not limited thereto. Specifically, the accompanying drawings demonstrate relationships among elements and have no limitation to the elements with respect to numbers, shapes, size, etc., which the drawings of the elements are not to scale, and dimensions of the elements are arbitrarily expanded or reduced for clarity. In practical applications, the number, shapes and size of the elements are determined by an actual design in demand, and a detailed layout of the actual elements may be more complex.

Figure 1A:
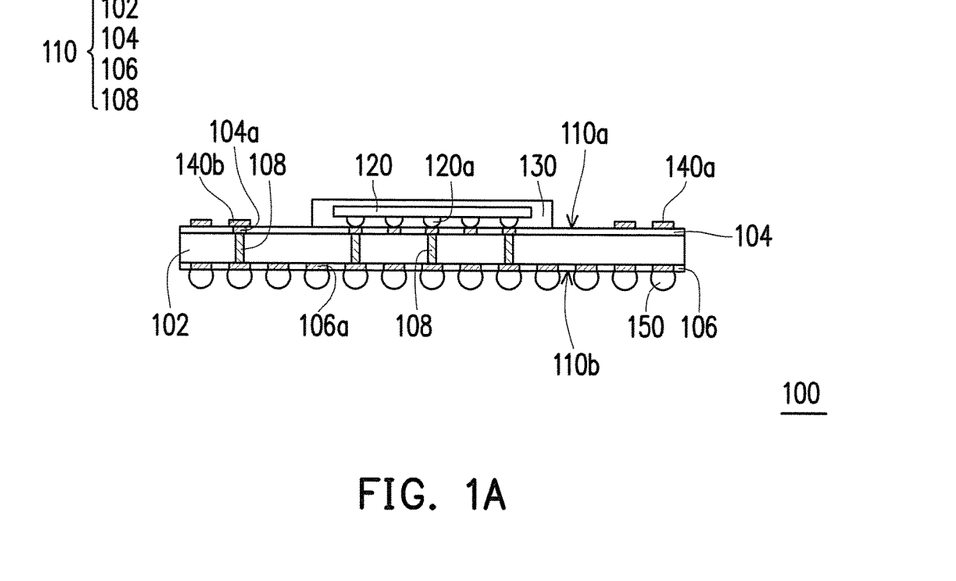
FIG. 1A to FIG. 1E are schematic cross-sectional views illustrating manufacturing method of a POP structure according to an embodiment of the invention.

FIG. 1A to FIG. 1E are schematic cross-sectional views illustrating manufacturing method of a POP structure 10 according to an embodiment of the invention. Referring to FIG. 1A, a bottom package structure 100 is formed. The bottom package structure 100 includes a first carrier 110, a first chip 120, a first encapsulant 130, a plurality of dummy connector pads 140a, a plurality of signal connector pads 140b, and a plurality of first conductive terminals 150. The first carrier 110 has a first surface 110a and a second surface 110b opposite to the first surface 110a. The first carrier 110 includes a core layer 102, a first circuit layer 104, a second circuit layer 106, and a plurality of conductive vias 108. The core layer 102 is an intermediate layer of the first carrier 110 and a material of the core layer includes, but is not limited to, glass, epoxy, polyimide (PI), bismaleimide trazine (BT), FR4, or other suitable materials. The first circuit layer 104 and the second circuit layer 106 are formed on two opposite surfaces of the core layer 102, so as to respectively constitute the first surface 110a and the second surface 110b of the first carrier 110. The first circuit layer 104 includes a plurality of conductive pads 104a and the second circuit layer 106 includes a plurality of conductive pads 106a. The conductive pads 104a and 106a may be formed using copper, solder, gold, nickel, or the like. In addition, the conductive pads 104a and 106a may be fabricated by photolithography and etching processes. However, the material and the fabrication method of the conductive pads 104a and 106a are not limited thereto, and other suitable material and methods may also be adopted. The conductive pads 104a and the conductive pads 106a are electrically connected through the conductive vias 108. Each of the conductive vias 108 penetrates through the core layer 102 to electrically connect the conductive pads 104a and the conductive pads 106a. Some circuit layers in the first carrier 110 are omitted in the illustration presented in FIG. 1A for simplicity. However, in some alternative embodiments, other than the first circuit layer 104 and the second trace layer 106, the first carrier 110 may also include additional circuit layers embedded in the core layer 102 based on the circuit design.

The first chip 120 is formed over the first surface 110a of the first carrier 110. In some embodiments, the first chip 120 is attached to the first carrier 110 in a flip-chip manner to electrically connect with the first carrier 110. An active surface of the first chip 120 is coupled to the conductive pads 104a of the first carrier 110 through bumps 120a. Furthermore, an underfill (not illustrated) may be formed in the gap between the first chip 120 and the first carrier 110 to enhance the reliability of the attachment process. The first chip 120 is, for example, an ASIC (Application-Specific Integrated Circuit). In some embodiments, the first chip 120 may be used to perform logic applications. However, it construes no limitation in the invention. Other suitable active devices may also be utilized as the first chip 120. Other than flip chip bonding, the first chip 120 may be coupled to the first carrier 110 through wire bonding or other connecting mechanisms in some alternative embodiments.

The first encapsulant 130 is formed over part of the first surface 110a of the first carrier 110 to encapsulate the first chip 120. The first encapsulant 130 exposes at least part of the first surface 110a. In some embodiments, the first chip 120 is completely encapsulated by the first encapsulant 130. In some alternative embodiments, the first encapsulant 130 may expose a surface of the first chip 120 to reduce the overall thickness. The first encapsulant 130 may include a molding compound disposed on the first carrier 110 by molding processes. In some alternative embodiments, the first encapsulant 130 may be formed by an insulating material such as epoxy or other suitable resins. A plurality of dummy connector pads 140a and a plurality of signal connector pads 140b are formed over the first surface 110a exposed by the first encapsulant 130. The signal connector pads 140b are disposed corresponding to the conductive pad 104a of the first carrier 110. Therefore, the dummy connector pads 140a may be electrically insulated from the first chip 120 while the signal connector pads 140b may be electrically connected to the first chip 120. A material of the dummy connector pads 140a and signal connector pads 140b may be identical to or different from the material of the conductive pads 104a, 106a.

The first conductive terminals 150 are formed over the second surface 110b of the first carrier 110. In some embodiments, the first conductive terminals 150 are conductive bumps such as solder balls. However, it construes no limitation in the invention. Other possible forms and shapes of the first conductive terminals 150 may be utilized. For example, the first conductive terminals 150 may take the form of conductive pillars in some alternative embodiments. The first conductive terminals 150 may be formed by a ball placement process and a reflow process. In some embodiments, the first conductive terminals 150 are disposed corresponding to the conductive pads 106a. Namely, the first conductive terminals 150 are electrically connected to the conductive pads 106a of the first carrier 110. Since the conductive pads 106a are electrically connected to the conductive pads 104a through the conductive vias 108, the first chip 120 is electrically connected to the first conductive terminals 150 sequentially through the bumps 120a, the conductive pads 104a, the conductive vias 108, and the conductive pads 106a.

Figure 1B:
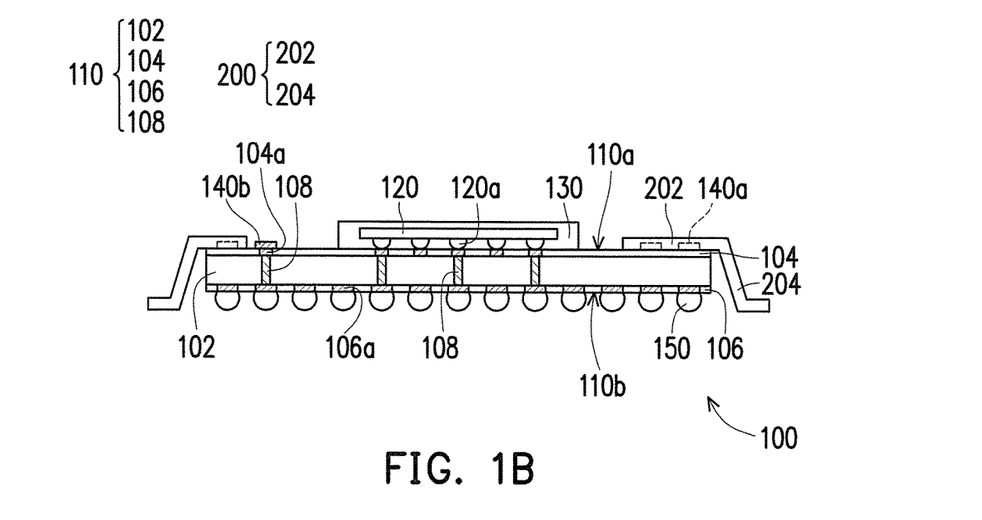
Figure 2:
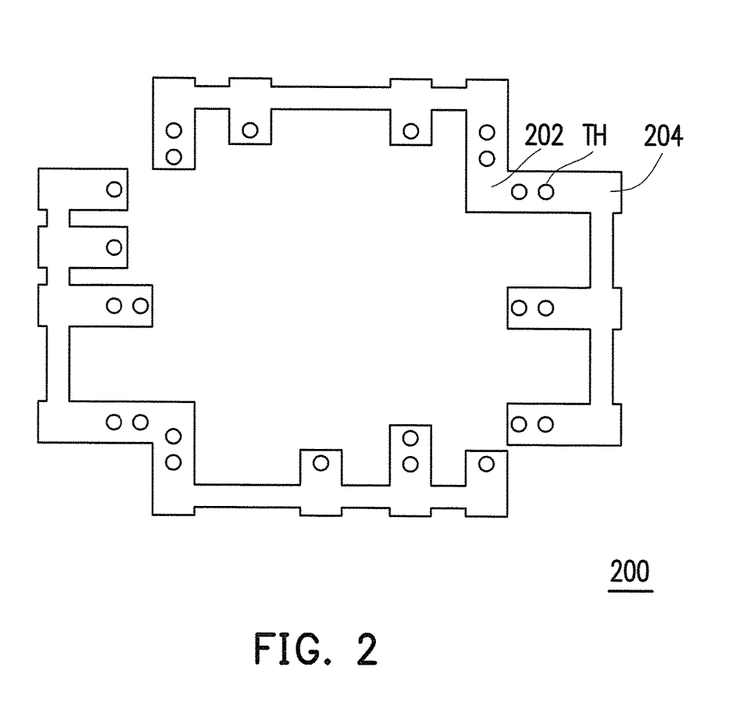
FIG. 2 is a schematic top view of a metal frame structure in FIG. 1B according to an embodiment of the invention.

FIG. 2 is a schematic top view of a metal frame structure 200 in FIG. 1B according to an embodiment of the invention. Referring to FIG. 2 and FIG. 1B, the metal frame structure 200 is formed over the bottom package structure 100. The metal frame structure 200 includes a body 202 and a plurality of terminal pins 204 connected to the body 202. The body 202 is disposed over the first surface 110a of the first carrier 110 while the terminal pins 204 extend outward from an edge of the bottom package structure 100. As illustrated in FIG. 1B, the dummy connector pads 140a are located underneath the metal frame structure 200. On the other hand, the signal connector pads 140b are exposed by the metal frame structure 200 for future electrical connections. It should be noted that the dummy connector pads 140a located underneath the metal frame structure 200 are not completely shielded by the metal frame structure 200. In detail, the body 202 of the metal frame structure 200 includes a plurality of through holes TH corresponding to the locations of the dummy connector pads 140a. Therefore, at least a portion of each of the dummy connector pads 140a located underneath the metal frame structure 200 is exposed by the through holes TH. A material of the metal frame structure 200 may include copper, lead, or other suitable metallic materials. The shape of the metal frame structure 200 illustrated in FIG. 2 is merely an exemplary demonstration, and the shape of the metal frame structure 200 may be altered based on the design of the bottom package structure 100.

Figure 1C:
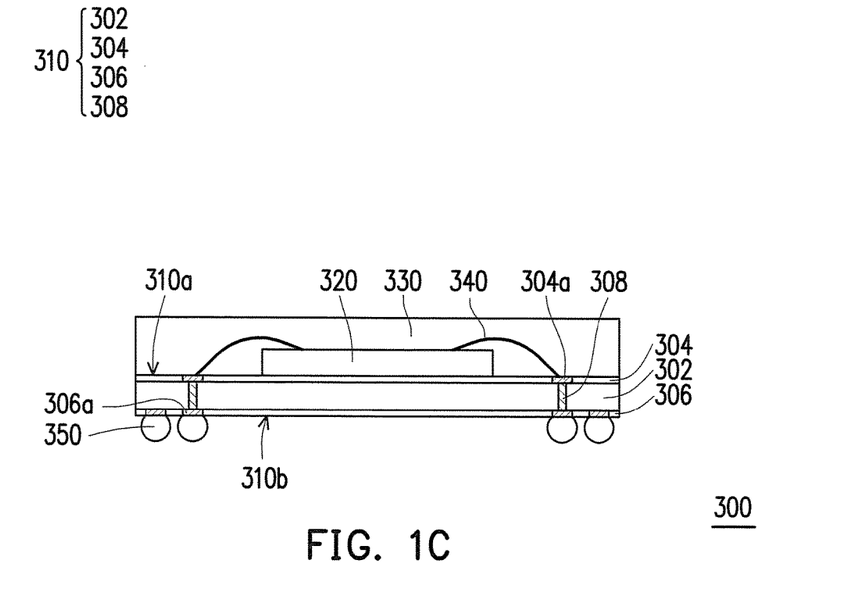

Referring to FIG. 1C, a top package structure 300 is formed. The top package structure 300 includes a second carrier 310, a second chip 320, a second encapsulant 330, at least one wire 340, and a plurality of second conductive terminals 350. Similar to the first carrier 110, the second carrier 310 also has a first surface 310a and a second surface 310b opposite to the first surface 110a and includes a core layer 302, a first circuit layer 304, a second circuit layer 306, and a plurality of conductive vias 308. The second carrier 310 functions in the same way as the first carrier 110, so the details thereof is omitted herein.

The second chip 320 is formed over the first surface 310a of the second carrier 310. In some embodiments, a die attach film (DAF; not illustrated) may be disposed between the second chip 320 and the first surface 310a of the second carrier 310 to enhance the adhesion between the two. The second chip 320 may be electrically coupled to the second carrier 310 through wire bonding. The at least one wire 340 may electrically connect the contact points on the active surface of the second chip 320 and the conductive pads 304a of the second carrier 310. Similar to that of the first chip 120, the second chip 320 may also include an ASIC. For example, the second chip 320 may be used to perform memory applications. However, it construes no limitation in the invention. Other suitable active devices may also be utilized as the second chip 320. Other than wire bonding, the second chip 320 may be coupled to the second carrier 310 through flip chip bonding or other connecting mechanisms in some alternative embodiments.

The second encapsulant 330 is formed over the first surface 310a of the second carrier 310 to encapsulate the second chip 320. In some embodiment, the second encapsulant 330 is formed over the entire first surface 310a of the second carrier 310 such that the first surface 310a is not exposed. The second encapsulant 330 may include a molding compound formed by molding processes. In some alternative embodiments, the second encapsulant 330 may be formed by an insulating material such as epoxy or other suitable resins.

The second conductive terminals 350 are formed over the second surface 310b of the second carrier 310. Similar to that of the first conductive terminals 150, the second conductive terminals 350 may also take the form of conductive bumps, conductive pillars, or the like. In some embodiments, the second conductive terminals 350 are disposed corresponding to the conductive pads 306a. Namely, the second conductive terminals 350 are electrically connected to the conductive pads 306a of the second carrier 310. Since the conductive pads 306a are electrically connected to the conductive pads 304a through the conductive vias 308, the second chip 320 is electrically connected to the second conductive terminals 350 sequentially through the at least one wire 340, the conductive pads 304a, the conductive vias 308, and the conductive pads 306a.

Figure 1D:
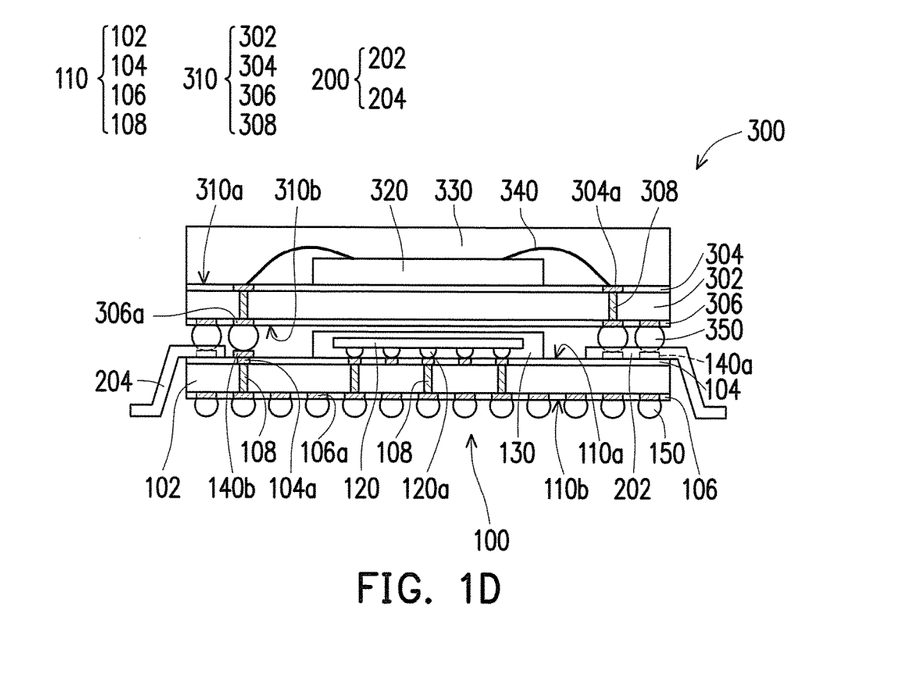

Referring to FIG. 1D, the top package structure 300 is stacked over the bottom package structure 100. A reflow process is performed on the second conductive terminals 350 to strengthen the adhesion between the top package structure 300 and the bottom package structure 100. At least a portion of the metal frame structure 200 is sandwiched between the top package structure 300 and the bottom package structure 100. At least one of the second conductive terminals 350 is inserted into the through holes TH of the metal frame structure 200 to connect with the dummy connector pads 140a exposed by the through holes TH. Therefore, the body 202 of the metal frame structure 200 is located between the top package structure 300 and the bottom package structure 100 while the terminal pins 204 extend outward from an edge of the top package structure 300. On the other hand, some of the second conductive terminals 350 are directly in contact with the signal connector pads 140b not located underneath the metal frame structure 200. As such, an electrical connection between the top package structure 300 and the bottom package structure 100 may be ensured.

Figure 1E:
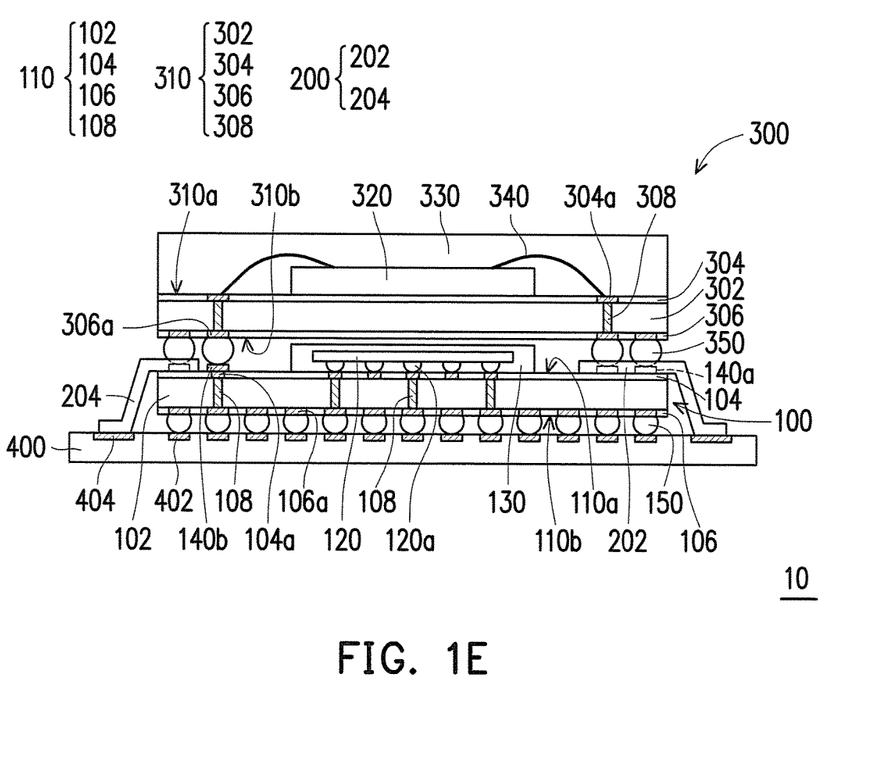

Referring to FIG. 1E, the bottom package structure 100 having the top package structure 300 formed thereon is disposed over a circuit board 400. A reflow process is performed to render the POP structure 10. The circuit board 400 is, for example, a printed circuit board (PCB) or a flexible circuit board (FPC). The circuit board 400 includes a plurality of signal pads 402 and a plurality of dummy pads 404, and the dummy pads 404 surround the signal pads 402. The signal pads 402 are used for signal transmission while the dummy pads 404 serve the function of heat dissipation. Namely, the dummy pads 404 are electrically insulated from the first chip 120 and the second chip 320. The first conductive terminals 150 are disposed corresponding to the signal pads 402 such that the bottom package structure 100 is electrically connected to the circuit board 400. On the other hand, the terminal pins 204 of the metal frame structure 200 extend outward from the edge of the top package structure 300 to connect the top package structure 300 and the dummy pads 404 of the circuit board 400.

As illustrated in FIG. 1E, the heat accumulated in the bottom package structure 100 and the top package structure 300 may be dissipated through at least two routes. The heat generated by the bottom package structure 100 and the top package structure 300 may be transferred through the first conductive terminals 150 and the second conductive terminals 350 to the circuit board 400 for further heat dissipation. Alternatively, the heat may be further dissipated through the path provided by the metal frame structure 200 to the circuit board 400. Since the POP structure 10 provides multiple heat dissipation paths, the cooling efficiency thereof may be significantly enhanced. Therefore, the performance of the POP structure 10 may be improved.

Figure 3A:
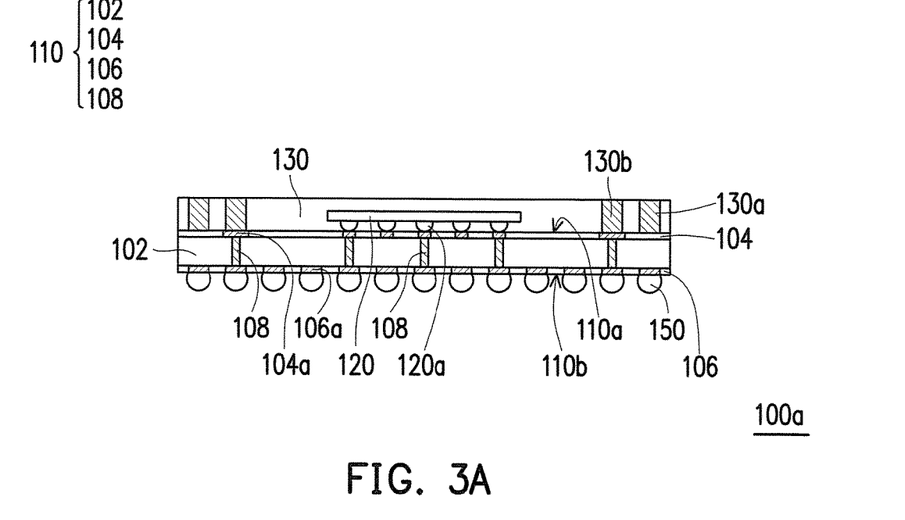
FIG. 3A to FIG. 3D are schematic cross-sectional views illustrating manufacturing method of a POP structure according to an embodiment of the invention.

FIG. 3A to FIG. 3D are schematic cross-sectional views illustrating manufacturing method of a POP 20 structure according to an embodiment of the invention. Referring to FIG. 3A, a bottom package structure 100a is formed. The bottom package structure 100a in FIG. 3A is similar to the bottom package structure 100 in FIG. 1A, so the detailed descriptions of similar elements are omitted herein. The difference between the two lies in that in the bottom package structure 100a of FIG. 3A, the first encapsulant 130 is formed on the entire first surface 110a of the first carrier 110. Moreover, the bottom package structure 100a includes a plurality of dummy through molding vias (TMV) 130a and a plurality of signal TMVs 130b penetrating through the first encapsulant 130. The dummy TMVs 130a may be electrically insulated from the first chip 120 while the signal TMVs 130b may be electrically connected to the first chip 120.

Figure 3B:
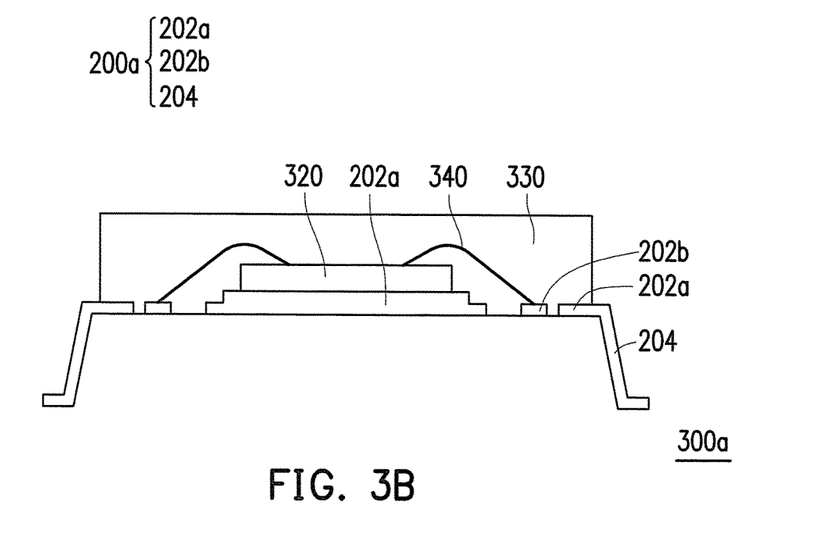
Figure 4:
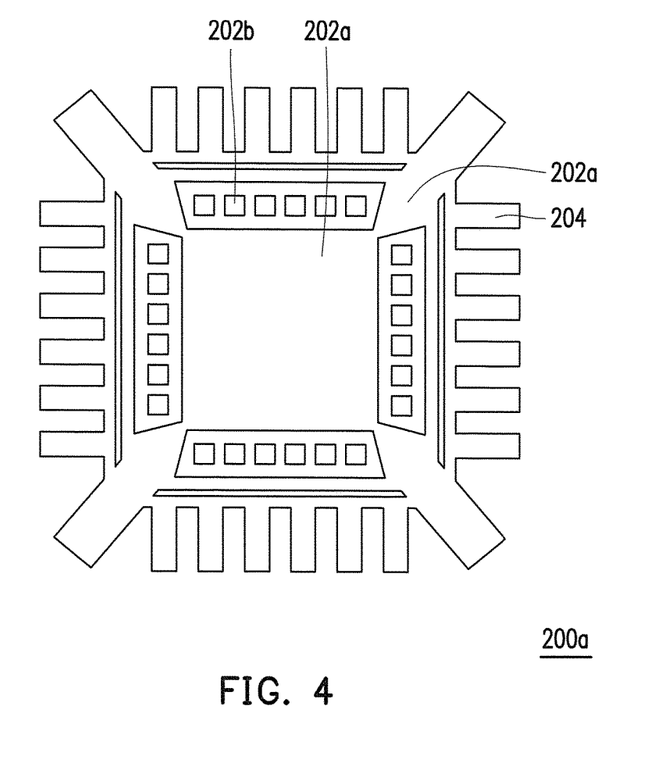
FIG. 4 is a schematic top view of a metal frame structure in FIG. 3B according to an embodiment of the invention.

FIG. 4 is a schematic top view of a metal frame structure 200a in FIG. 3B according to an embodiment of the invention. Referring to FIG. 3B, a top package structure 300a including the metal frame structure 200a is formed. Unlike the top package structure 300 illustrated in FIG. 1C, the top package structure 300a of FIG. 3B may be a carrier free package structure. The metal frame structure 200a includes a first body 202a, a plurality of second bodies 202b, and a plurality of terminal pins 204. The first body 202a is separated from the second bodies 202b so the first body 202a is electrically insulted from the second bodies 202b. As illustrated in FIG. 4, the terminal pins 204 are connected to the first body 202a and extend radially outward from the first body 202a. A portion of the first body 202a of the metal frame structure 200a may serve as a substrate for supporting the second chip 320. In some embodiments, a die attach film (DAF; not illustrated) may be disposed between the second chip 320 and the first body 202a of the metal frame structure 200a to enhance the adhesion between the two. The second chip 320 may be electrically coupled to the metal frame structure 200a through wire bonding. the at least one wire 340 may electrically connect the contact points on the active surface of the second chip 320 and the second bodies 202b of the metal frame structure 200a.

The top package structure 300a may be formed by, for example, the following steps. A carrier (not illustrated) having an adhesion layer (not illustrated) formed thereon is provided. Subsequently, a metallic layer is formed over the adhesion layer. The metallic layer is patterned through photolithography and etching processes to render the first body 202a, the second bodies 202b, and the terminal pins 204 over the carrier. Thereafter, the second chip 320 is disposed over the first body 202a and the at least one wire 340 are formed to connect the active surface of the second chip 320 and the second bodies 202b. The second encapsulant 330 is formed to encapsulate the second chip 320, the first body 202a, and the second bodies 202b. On the other hand, the terminal pins 204 of the metal frame structure 200a is exposed by the second encapsulant 330. The second encapsulant 330 may include a molding compound formed by molding processes. In some alternative embodiments, the second encapsulant 330 may be formed by an insulating material such as epoxy or other suitable resins. After encapsulation, the carrier and the adhesion layer are removed, and the tell Anal pins 204 are bent to obtain the top package structure 300a illustrated in FIG. 3B.

Figure 3C:
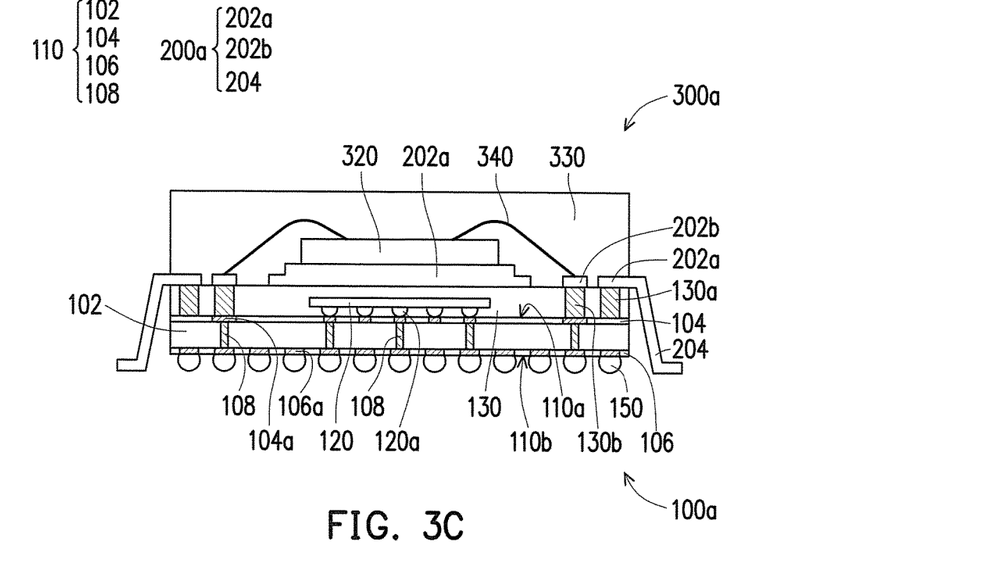

Referring to FIG. 3C, the top package structure 300a is stacked over the bottom package structure 100a. The second bodies 202b of the metal frame structure 200a are coupled to the signal TMVs 130b of the bottom package structure 100a to render electrical connection between the top package structure 300a and the bottom package structure 100a. At least a portion of the first body 202a may be coupled to the dummy TMVs 130a for heat dissipation purposes. As illustrated in FIG. 3C, the terminal pins 204 of the metal frame structure 200a extend outward from an edge of the bottom package structure 100a.

Figure 3D:
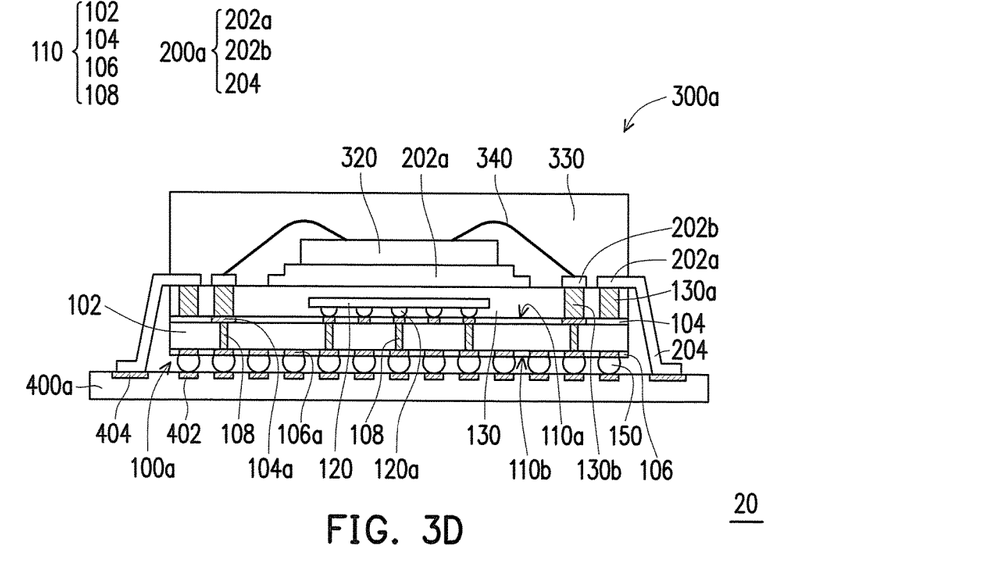

Referring to FIG. 3D, the bottom package structure 100a having the top package structure 300a formed thereon is disposed over a circuit board 400. A reflow process is performed to render the POP structure 20. The circuit board 400 is, for example, a printed circuit board (PCB) or a flexible circuit board (FPC). The circuit board 400 includes a plurality of signal pads 402 and a plurality of dummy pads 404, and the dummy pads 404 surround the signal pads 402. The signal pads 402 are used for signal transmission while the dummy pads 404 serve the function of heat dissipation. Namely, the dummy pads 404 are electrically insulated from the first chip 120 and the second chip 320. The first conductive terminals 150 are disposed corresponding to the signal pads 402 such that the bottom package structure 100a is electrically connected to the circuit board 400. On the other hand, the terminal pins 204 of the metal frame structure 200a extend outward from the first body 202a to connect the top package structure 300a and the dummy pads 404 of the circuit board 400.

As illustrated in FIG. 3D, the heat accumulated in the bottom package structure 100a and the top package structure 300a may be dissipated through at least two routes. For example, the heat generated by the bottom package structure 100a and the top package structure 300a may be transferred through the first conductive terminals 150 and the dummy TMVs 130b to the circuit board 400 for further heat dissipation. Alternatively, the heat may also be dissipated through the path provided by metal frame structure 200a to the circuit board 400. Since the POP structure 20 provides multiple heat dissipation paths, the cooling efficiency thereof may be significantly enhanced. Therefore, the performance of the POP structure 20 may be improved.

Based on the above, a metal frame structure is formed between the top package structure and the bottom package structure. Therefore, heat generated by the top package structure and the bottom package structure during operation may be effectively dissipated with the aid of the metal frame structure. As a result, the cooling efficiency of the POP structure may be significantly enhanced, thereby providing better performance in the devices utilizing the POP structure.

The above disclosure includes the exemplary examples of the invention, however, the scope of the invention is not limited thereto. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package-on-package (POP) structure, comprising:
   a circuit board having a plurality of signal pads and a plurality of dummy pads, wherein the dummy pads surround the signal pads;
   a bottom package structure over the circuit board, wherein the bottom package structure is electrically connected to the signal pads of the circuit board and comprises:
      a first carrier having a first surface and a second surface opposite to the first surface;
      a first chip over the first surface of the first carrier, wherein the first chip is electrically connected to the first carrier;
      a first encapsulant encapsulating the first chip, wherein the first encapsulant exposes at least part of the first surface;
      a plurality of connector pads over the first surface exposed by the first encapsulant; and
      a plurality of first conductive terminals over the second surface of the first carrier, wherein the first conductive terminals are disposed corresponding to the signal pads of the circuit board;
   a top package structure over the bottom package structure, wherein the top package structure is electrically connected to the bottom package structure; and
   a metal frame structure, wherein the metal frame structure comprises a body and a plurality of terminal pins, the body is sandwiched between the top package structure and the bottom package structure, and the terminal pins extend outward from underneath the top package structure to connect the top package structure and the dummy pads of the circuit board.

2. The POP structure according to claim 1, wherein the first chip is electrically connected to the first carrier in a flip-chip manner.

3. The POP structure according to claim 1, wherein the top package structure comprises:
   a second carrier having a first surface and a second surface opposite to the first surface;
   a second chip over the first surface of the second carrier, wherein the second chip is electrically connected to the second carrier;
   a second encapsulant encapsulating the second chip; and
   a plurality of second conductive terminals over the second surface of the second carrier, wherein the second conductive terminals are connected to the connector pads.

4. The POP structure according to claim 3, wherein the second chip is electrically connected to the second carrier through wire bonding.

5. The POP structure according to claim 3, wherein the body of the metal frame structure comprises a plurality of through holes, the through holes expose the connector pads of the bottom package structure, and at least one of the second conductive terminal is inserted into the through holes to connect with the connector pads.

6. A package-on-package (POP) structure, comprising:
   a circuit board having a plurality of signal pads and a plurality of dummy pads, wherein the dummy pads surround the signal pads;

a bottom package structure over the circuit board, wherein the bottom package structure is electrically connected to the signal pads of the circuit board; and a top package structure over the bottom package structure, wherein the top package structure comprises a metal frame structure, the metal frame structure comprises a first body, a plurality of second bodies, and a plurality of terminal pins, the second bodies are electrically connected to the bottom package structure and the first body is electrically insulated from the second bodies, the terminal pins extend outward from the first body to connect the top package structure and the dummy pads of the circuit board.

7. The POP structure according to claim 6, wherein the bottom package structure comprises:
   a first carrier having a first surface and a second surface opposite to the first surface;
   a first chip over the first surface of the first carrier, wherein the first chip is electrically connected to the first carrier;
   a first encapsulant encapsulating the first chip;
   a plurality of first conductive terminals over the second surface of the first carrier, wherein the first conductive terminals are disposed corresponding to the signal pads of the circuit board; and
   a plurality of through molding vias (TMV) penetrate through the first encapsulant, wherein the second bodies of the metal frame structure are electrically connected to the bottom package structure through the TMVs.

8. The POP structure according to claim 7, wherein the first chip is electrically connected to the first carrier in a flip-chip manner.

9. The POP structure according to claim 7, wherein the top package structure further comprises:
   a second chip over the first body of the metal frame structure; and
   a second encapsulant encapsulating the second chip.

10. The POP structure according to claim 9, wherein the second chip is electrically connected to the second bodies of the metal frame structure through wire bonding.

11. The POP structure according to claim 9, wherein the second encapsulant encapsulates the first body and the second bodies of the metal frame structure.

12. The POP structure according to claim 9, wherein the second encapsulant exposes the terminal pins of metal frame structure.

13. A method of manufacturing a package-on-package (POP) structure, comprising:
   forming a bottom package structure, comprising:
      providing a first carrier having a first surface and a second surface opposite to the first surface;
      forming a first chip over the first surface of the first carrier, wherein the first chip is electrically connected to the first carrier;
      forming a first encapsulant to encapsulate the first chip, wherein the first encapsulant exposes at least part of the first surface;
      forming a plurality of connector pads over the first surface exposed by the first encapsulant; and
      forming a plurality of first conductive terminals over the second surface of the first carrier;
   forming a top package structure;
   forming a metal frame structure, wherein the metal frame structure is connected to the top package structure, the metal frame structure comprises at least one body and a plurality of terminal pins extend outward from the at least one body;
   stacking the top package structure over the bottom package structure, wherein the top package structure is electrically connected to the bottom package structure, and the at least one body of the metal frame structure is sandwiched between the top package structure and the bottom package structure; and
   forming the bottom package structure having the top package structure disposed thereon over a circuit board, wherein the circuit board has a plurality of signal pads and a plurality of dummy pads, the dummy pads surround the signal pads, the bottom package structure is electrically connected to the signal pads, the terminal pins of the metal frame structure extend outward from underneath the top package structure to connect the top package structure and the dummy pads, and the first conductive terminals are disposed corresponding to the signal pads of the circuit board.

14. The method according to claim 13, wherein the step of forming the metal frame structure precedes the step of forming the top package structure.

15. The method according to claim 14, wherein the at least one body of the metal frame structure comprises a plurality of through holes, the top package structure comprises a plurality of conductive terminals, and in the step of stacking the top package structure over the bottom package structure, at least one of the conductive terminals is inserted into the through holes.

16. The method according to claim 13, wherein the step of forming the metal frame structure and the step of forming the top package structure are performed simultaneously.

17. The method according to claim 16, wherein the step of forming the metal frame structure and the step of forming the top package structure precede the step of stacking the top package structure over the bottom package structure.

18. The method according to claim 16, wherein the bottom package structure comprises a plurality of through molding vias (TMV), and in the step of stacking the top package structure over the bottom package structure, portions of the at least one body of the metal frame structure is coupled to the TMVs.

* * * * *